United States Patent [19]

Jones et al.

[11] Patent Number: 5,386,196

[45] Date of Patent: Jan. 31, 1995

[54] SYSTEM AND METHOD FOR ACCURATE CONTACTLESS MEASUREMENT OF THE RESISTIVITY OF A TEST MATERIAL

[75] Inventors: Dennis R. Jones, Acworth, Ga.; James E. Lutz, Carson City, Nev.; Richard H. Campbell, Carson City, Nev.; Denys D. Overholser, Carson City, Nev.

[73] Assignee: Denmar, Inc., Carson City, Nev.

[21] Appl. No.: 110,580

[22] Filed: Aug. 23, 1993

[51] Int. Cl.$^6$ ............................................. G01R 27/26
[52] U.S. Cl. ................................. 324/667; 333/24C; 324/668
[58] Field of Search .................... 333/24 C, 154, 30 R; 324/667g333, 183, 707

[56] References Cited

U.S. PATENT DOCUMENTS

| | | | |
|---|---|---|---|
| 2,948,850 | 8/1960 | Ederer | 324/667 |
| 2,997,672 | 8/1961 | Reinsmith | 333/24 C |
| 3,234,460 | 2/1966 | Baird | 324/668 |
| 3,735,247 | 5/1973 | Harker | 324/34 |
| 3,771,069 | 11/1973 | Levacher et al. | 333/24 C |
| 3,800,248 | 3/1974 | Speiser et al. | 333/30 R |
| 3,959,723 | 5/1976 | Wagner | 324/668 |
| 4,002,996 | 1/1977 | Klebanoff et al. | 324/668 |
| 4,234,844 | 11/1980 | Yukl | 324/58.5 |
| 4,476,430 | 10/1984 | Wright et al. | 324/61 |
| 4,853,617 | 8/1989 | Douglas et al. | 324/67 |
| 4,924,172 | 5/1990 | Holmgren | 324/664 |
| 4,950,935 | 8/1990 | Furukawa | 333/154 |
| 4,987,391 | 1/1991 | Kusiak, Jr. | 333/24 C |
| 5,005,019 | 4/1991 | Zaghloul et al. | 343/700 |
| 5,103,181 | 4/1992 | Gaisford et al. | 324/637 |
| 5,132,617 | 7/1992 | Leach et al. | 324/207 |
| 5,177,445 | 1/1993 | Cross | 324/637 |
| 5,210,500 | 5/1993 | Pingel et al. | 324/667 |

*Primary Examiner*—Walter E. Snow
*Assistant Examiner*—Maura K. Regan
*Attorney, Agent, or Firm*—Hopkins & Thomas

[57] ABSTRACT

A system (10) accurately measures the resistivity of a material (12) via capacitive coupling without contact with the material (12). A transmission electrode (14a) sends signals through the material (12) to a reception electrode (14b). An oscillation mechanism (16) forwards a periodic signal at a predetermined frequency f to the electrode (14a), and a detection mechanism (18) receives a resistivity signal from the electrode (14b), which signal is proportional to the resistivity of the material (12), and translates the resistivity signal into a resistivity value for the material (12). The oscillation mechanism (16) comprises an oscillator (21) connected through a transformer (T1) to a quarter-wavelength stub (24), which feeds an excitation signal to the transmission electrode (14a). The detection mechanism (18) comprises a detector (31) connected via a transformer (T2) to a quarter-wavelength stub (26), which is directly connected to the reception electrode (14b). The detector demodulates the resistivity signal, which can then be displayed on a user interface, such as resistivity meter (32). The stubs (24, 26) prevent transfer of signals between the electrodes (14a, 14b) when no material (12) is present. Further, the system (10) is constructed so that it resonates at the predetermined frequency f.

18 Claims, 3 Drawing Sheets

SYSTEM AND METHOD FOR ACCURATE CONTACTLESS MEASUREMENT OF THE RESISTIVITY OF A TEST MATERIAL

FIELD OF THE INVENTION

The present invention generally relates to a system and method for contactless measurement of the electrical resistivity $\rho$ of any material encapsulated, contained, or otherwise isolated by a substantially dielectric material via capacitive coupling using RF electromagnetic energy.

BACKGROUND ART

In the past, there has been much effort in developing systems for measuring the resistivity $\rho$ (resistance per unit area; inverse of conductivity $\sigma$) of materials, usually liquids or solids, which are encapsulated, contained, or otherwise isolated by a dielectric (insulating) material in order to determine and analyze other medium characteristics. One reason, among others, is the development of new radar absorbing material (RAM). RAM may comprise a selectable amount of conductive materials encapsulated within insulating materials for permitting the varying of resistivity across the RAM.

Another reason for needing such a system is that federal and commercial product performance standards are becoming increasingly demanding and require an effective, low cost, non-invasive, and nondestructive way to measure characteristics of products which are contained or encapsulated. As examples, it may be necessary to detect the contamination level of industrial fluids, including water, liquid lubricants, and solvents, or it may be necessary to determine the amount of one substance within another, such as the quantity of fat, salt, or water, in food.

By measuring the resistivity of a material, the contents and other characteristics of the material can be determined because many of the contents have well defined resistivity levels. Well known systems for measurement of resistivity typically involve the use of a Wheatstone bridge or a Wien bridge. However, both of the foregoing techniques require direct contact of the bridge with the material under test. This predicament is unacceptable when evaluating a material which is encapsulated, contained, or otherwise isolated by a dielectric material. Furthermore, direct contact methods for measuring resistivity are generally not permissible when analyzing the contents of food, sterile substances, or other materials which are susceptible to undesirable contamination upon contact.

There are some situations in which the resistivity of limited size materials could be determined and analyzed with radio frequency (RF) transmission tests. The resistivity is measured by transmitting an RF electromagnetic signal to the material and receiving a reflected electromagnetic signal. The analysis is based on the fact that the transmission and reflection coefficients equal one, according to conservation laws, and the following relationships:

$$R = (\eta - 1)/(\eta + 1) \tag{1}$$

$$R = (\eta - 1)/(\eta + 1) \tag{1}$$

$$\eta = \sqrt{\mu_r/e_r} \, \tan k(ik_o d \sqrt{\mu_r e_r}) \tag{2}$$

where R=reflection coefficient, $\eta$=normalized input impedance, $\mu_r$=relative permeability, and $e_r$=relative permitivity. However, practical test setups using this method are limited to laboratory type conditions and require expensive, cumbersome equipment in order to generate results which are generally plagued with errors and exhibit questionable accuracy at best. Furthermore, this method is very time consuming, is mathematically intensive, and requires a high level of skill to practice it.

U.S. Pat. No. 5,210,500 to Pingel et al. describes a system for contactless measurement of the electrical impedance and resistivity of a material using capacitive coupling and a circular coupling device having three electrodes. Although the system is not devoid of all merit, the system is complex and mathematically intensive in that it requires measurement and analysis of three different frequencies, phase, and stray capacitance. Moreover, the system has limited applicability.

SUMMARY OF THE INVENTION

An object of the present invention is to overcome the inadequacies and deficiencies of the prior art as noted above and as further known in the industry.

Another object of the present invention is to provide a system and method for measuring the resistivity of any liquid or solid material without direct contact with the material.

Another object of the present invention is to provide a system and method for measuring the resistivity of a material which is encapsulated, contained, or otherwise isolated by a dielectric material.

Another object of the present invention is to provide a system and method for measuring the resistivity of a generally insulating materials which have conductive materials suspended therein.

Another object of the present invention is to provide a system and method for measuring the resistivity of a material which can be implemented with a low level of skill to achieve accurate results.

Another object of the present invention is to provide a system and method for measuring the resistivity of a material which is simple in design, inexpensive to manufacture, and efficient as well as reliable in operation.

Another object of the present invention is to provide a system for measuring the resistivity of a material which is portable and user friendly.

Another object of the present invention is to provide a system and method for measuring the resistivity of a material using near field electromagnetic energy (capacitive coupling).

Briefly described, the present invention is a system and method for contactless measurement of the resistivity of a material via capacitive coupling. A first induction transformer has a first primary coil and a first secondary coil. The first primary coil receives a periodic signal at a predetermined frequency f. A first transmission line transformer, preferably a quarter-wavelength stub at frequency f, is connected to the first secondary coil. A transmission electrode is connected to the first transmission line transformer. The transmission electrode capacitively couples to a material when the material is disposed in close proximity to the transmission electrode.

A reception electrode is disposed for capacitively coupling to the material when the material is capacitively coupled to the transmission electrode. The transmission and reception electrodes can take many different configurations as described in the examples herein. A second transmission line transformer, preferably a quarter-wavelength stub at frequency f, is connected to the reception electrode. A second induction transformer has a second primary coil and a second secondary coil. The second primary coil is connected to the second transmission line transformer and the second secondary coil is connected to the RF detector. The detector in turn rectifies the AC signal which is indicative of the resistivity of to the material.

Significantly, in the foregoing system, the first and second transmission line transformers prevent signals from being sent from the transmission electrode to the reception electrode when nonconductive materials are coupled to these electrodes. Further, when a conductive material is coupled to the electrodes, the first and second transmission line transformers additively act as half-wavelength lines to optimally transfer the signal to the remainder of the circuitry without significant attenuation. Furthermore, the predetermined frequency f of the periodic signal and the coil ratios of the first and second induction transformers are defined so that the first and second transmission line transformers, the first and second induction transformers, and the combination of the transmission and reception electrode capacitances form a series resonant circuit when the electrodes are in contact with a conductive plate. The foregoing predicament ensures maximum current flow when a conductive material is coupled to the electrodes and minimum current flow when nonconductive material (including air) is in contact with the electrodes.

Other objects, features, and advantages of the present invention will become apparent to one of skill in the art upon examination of the following drawings and detailed description.

BRIEF DESCRIPTION OF THE DRAWINGS

The present invention can be better understood with reference to the following drawings. The drawings are not necessarily to scale, emphasis instead being placed upon clearly illustrating principles of the present invention.

DETAILED DESCRIPTION OF THE PREFERRED EMBODIMENT

Figure 1:
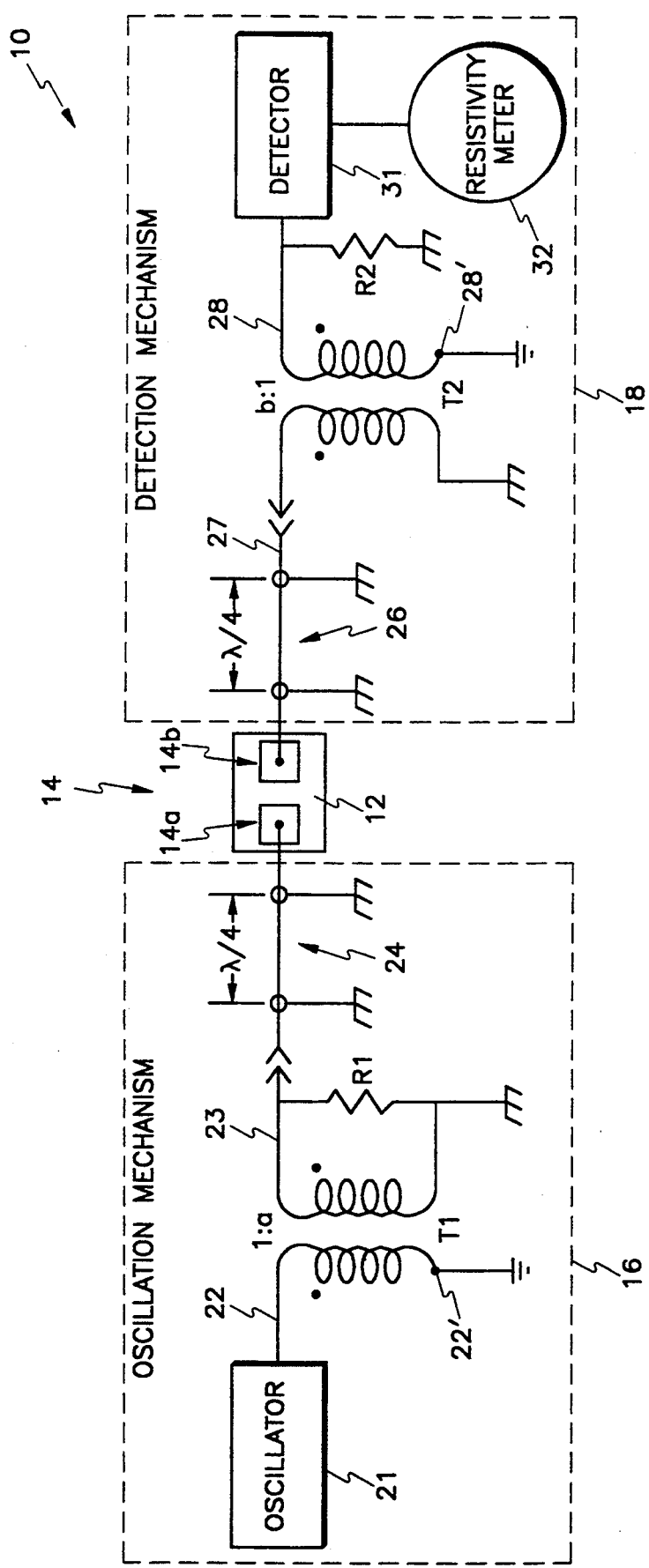
FIG. 1 is a block diagram illustrating the novel system and associated methodology of the present invention.
Figure 3:
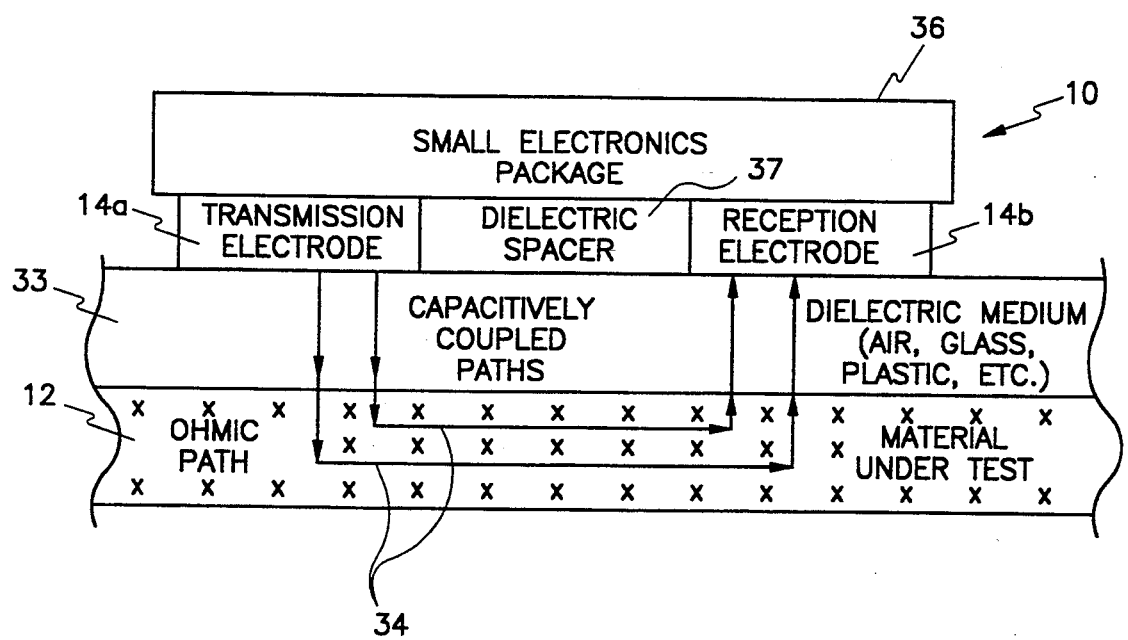
FIG. 3 is a cross-sectional view of the dual electrodes and material of FIGS. 1 and 2 showing capacitively coupled conductance paths.

With reference now to the drawings wherein like reference numerals designate corresponding parts throughout the several views, FIG. 1 illustrates a system 10 for the accurate contactless measurement of the electrical resistivity of a material 12 via concurrent capacitive coupling of the material 12 by a planar rectangular transmission electrode 14a and a planar rectangular reception electrode 14b of the system 10. For convenience and portability, the system 10 may be easily disposed within a compact electronics package 36 (FIG. 3). The material 12 may be a liquid or solid and may be encapsulated, contained, or otherwise isolated by a medium, such as a substantially dielectric material, through which capacitive coupling may be implemented. "Resistivity" as used herein refers to the complex ratio of voltage to current. Moreover, the standard unit for resistivity is ohms per unit of area (e.g., $\Omega/in^2$).

The system 10 comprises an oscillation mechanism 16 connected to the transmission electrode 14a, and a detection mechanism 18 connected to the reception electrode 14b. The oscillation mechanism 16 has an oscillator 21 for providing a periodic signal 22, preferably a sinusoid, having a predetermined frequency f to the primary coil of a transformer T1 having a coil ratio 1:a. In the preferred embodiment, the coil ratio 1:a is 1:2. Optionally, the isolated secondary coil of the transformer T1 has a termination resistor R1 across it for minimizing ringing and/or reflections ultimately resulting at node 23 from the periodic signal 22. Further, a transmission line stub, or transmission line transformer, is connected between the secondary coil of the transformer T1 at node 23 and the transmission electrode 14a. The transmission line stub 24 is preferably a quarter-wavelength ($\lambda/4$) stub.

The detection mechanism 18 has a transmission line stub 26 connected between the reception electrode 14b and the primary coil of a transformer T2, with a coil ratio of b:1. Preferably, the transmission line stub 26 is a quarter-wavelength stub and the ratio b:1 is approximately 2:1. Further, the isolated secondary coil of the transformer T2 has a termination resistor R2 disposed across it for preventing ringing and/or reflections produced from a periodic signal 28 that is a function of the resistivity which is initially induced by the reception electrode 14b. A detector 31 receives the resistivity RF signal 28 and rectifies or detects the envelope of the RF signal and produces a DC level that is directly proportional to the resistivity. Optionally, a resistivity meter 32 may be interfaced with the detector 31 so that a user may view in real time the instantaneous resistivity of the material 12.

A basic capacitance technique is used to transmit and receive energy to and from the material 12. However, unlike traditional capacitance coupling, the capacitance coupling in accordance with the present invention is performed within the VHF (very high frequency) signal range, preferably at approximately 155.5 megahertz (MHz). VHF signals are selected because they readily penetrate through dielectric materials 12, require relatively small electrodes 14a, 14b, and can be implemented with physically small components.

The capacitance technique utilized in the present invention will now be described relative to FIGS. 2 and 3. In essence, the measurements of resistivity are generated by emitting and detecting RF energy in the near field (below the cutoff frequency) of electrodes 14a, 14b, so that capacitive coupling uniquely and exclusively measures the material 12 (shown in FIG. 2 as a generally dielectric material having internal conductive bodies 12'). Traditional RF propagation methods utilize a launching mechanism, that is, an antenna, to emit and then receive RF electromagnetic waves. In the preferred embodiment, electrodes 14a, 14b are printed circuit board elements and are very small with respect to the wavelength λ of the predetermined frequency f of the periodic signal 22. When the electrodes 14a, 14b are excited with RF energy by oscillation mechanism 16 while the electrodes 14a, 14b are in close proximity to the material 12, radial conductive currents 34 are generated by capacitively coupling between the electrodes 14a, 14b and importantly through the material 12 and any dielectric material 33 interposed therebetween.

The foregoing phenomenon is best illustrated in FIG. 3, which shows a cross-sectional view of the system 10 enclosed within a small electronics package 36 having externally exposed electrodes 14a, 14b separated by a dielectric spacer 37 (helping to isolate electrodes 14a, 14b from each other) and engaged with a dielectric medium 33 situated between the system 10 and the material 12 under test. As illustrated in FIG. 3, the transmission electrode 14a is capacitively coupled through any dielectric material 33 into the material 12 under test. Further, the conductance path through the material 12 is subject to ohmic losses, which are a function of the current flow opposition of the material 12. Finally, the conductance path is capacitively coupled back to the reception electrode 14b of the system 10.

In essence, RF energy is coupled through the material 12 as a function of resistance and reactance (substantially conductance) of the material 12. The detection mechanism 18 senses the RF energy as a function of the resistance and capacitive reactance of the material 12 under test. The extreme cases of detection by the detection mechanism 18 include the scenario when a conductor is connected between the electrodes 14a, 14b, thus resulting in maximum signal transfer, and the case where an insulator is disposed between the electrodes 14a, 14b, resulting in minimum signal transfer.

In order to prevent or inhibit capacitive coupling of the transmission electrode 14a with the reception electrode 14b in the absence of a material 12, transmission line stubs 24, 26 respectively are connected to the corresponding electrodes 14a, 14b. In general, an open circuit, quarter-wavelength stub appears as a short circuit at its input terminals. Thus, the quarter-wavelength stubs 24, 26 prevent signals from being sent and received from the respective electrodes 14a, 14b when no material 12 is coupled to the electrodes 14a, 14b. Furthermore, when a conductive material 12 is coupled to the electrodes 14a, 14b, the combination of the quarter-wavelength stubs 24, 26 function as a half-wavelength transmission line, which optimally transfers the periodic signal present at node 23 to node 27 without any significant change or attenuation.

Worth noting is that the dielectric spacer 37 which provides the obvious isolation of the electrodes 14a, 14b from each other in the electrode configuration 14, thereby helping to minimize undesirable communications between the electrodes 14a, 14b when no material 12 is present.

In order to provide maximum sensitivity and optimal performance and precision in the determination of the resistivity of the material 12, a resonant circuit which resonates at the predetermined frequency f is constructed around the electrodes 14a, 14b in the system 10 of FIG. 1. More specifically, the capacitance contributed by the combination of the transmission and reception electrodes 14a, 14b in the presence of a highly conductive material 12 is offset by the inductance contributed by the transformers T1, T2 and the stubs 24, 26. This concept is best illustrated in FIG. 4.

Figure 4:
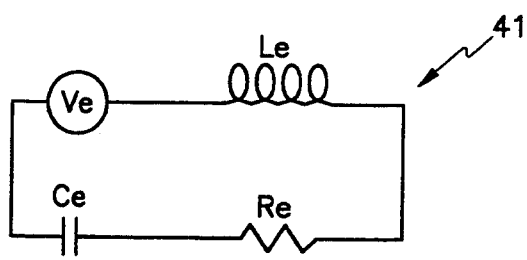
FIG. 4 is a circuit diagram illustrating an equivalent circuit formed from the system of FIG. 1 coupled with the material under test.

Referring to FIG. 4, an equivalent resonant circuit 41 comprises an induced frequency f into the isolated circuit formed by the secondary of transformer $T_1$; transmission line 24; transmission electrode 14a; conductive material 12; reception electrode 14b; transmission line 26; and the primary coil of transformer $T_2$. The induced frequency f is represented by voltage generator equivalent $V_e$; lumped equivalent inductance $L_e$ of $T_1$, $T_2$ and transmission lines 24, 26; lumped equivalent capacitance $C_e$ of elements 14a, 14b in contact with a highly conductive material 12 and transmission lines 24, 26; lumped equivalent resistance $R_e$ of the material 12 under test and circuit interconnection resistance. It should be noted that a dielectric 33 is assumed between elements 14a and 14b and the material 12 under test forming the capacitor which is the dominant contributor of lumped capacitance $C_e$. In the preferred embodiment, the reactance of inductance $L_e$ is designed to be equivalent to the reactance of capacitance $C_e$ at resonance, so that they offset each other and provide for maximum current flow in the presence of a highly conductive material under test.

The inductance $L_e$ is manipulated by adjusting the coil ratios 1:a, b:1 of respective transformers T1, T2 and/or the lengths of the transmission line stubs 24, 26. When a purely conductive material 12 is coupled to the electrodes 14a, 14b, the system 10, as indicated in the equivalent circuit 41 of FIG. 4, resonates at the predetermined frequency f (155.5 MHz) in the preferred embodiment. When no material 12 or a material 12 of infinite (∞) resistivity is coupled to the electrodes 14a, 14b, then the capacitance $C_e$ changes and the equivalent circuit 41 is detuned for the predetermined frequency f such that minimum current flows in the system 10. The foregoing configuration allows maximum current to be developed in the system 10 when a conductive material 12 is present and minimum current to be developed in the system 10 when no material 12 is present.

It should be emphasized that the length of the transmission lines 24, 26 have a direct bearing on the resonance of the equivalent circuit 41 of FIG. 4. If the transmission line stubs 24, 26 are excessively long, then the circuit 41 may be detuned by excessive inductance. Alternatively, if the transmission line stubs 24, 26 are too short, then the circuit 41 may be detuned by excessive capacitance.

Because of the combination of the stubs 24, 26 and the resonant nature of the system 10, as previously described, the signal-to-noise (S/N) ratio of the signals forwarded to the detector 31 is greater than 27 decibels (dB) at the preferred predetermined frequency f=155.5 MHz. This feature enables accurate measurement of resistivity within at least 5 percent (%) precision including mechanical tolerances.

Electrodes 14a, 14b can be configured so that they are either sensitive or insensitive to polarization of the material 12. A material 12 which is polarized is one that exhibits a nonhomogeneous resistivity/conductivity along an axis through the material 12 due to, among other things, the nature of the inherent molecular alignment in the material 12. For example, composite materials are sometimes constructed with carbon strands in one direction and with fiberglass strands interleaved with the carbon sometimes constructed with carbon strands in one direction and with fiberglass strands interleaved with the carbon strands in a substantially orthogonal (substantially perpendicular) direction. In this configuration, resistivity measurements would indicate lower resistivity in the direction of the carbon strands as compared with the direction of the fiberglass strands.

Generally, electrodes 14a, 14b which are insensitive to polarization are desired in cases where only a very accurate average resistivity of a material 12 is desired. Electrodes 14a, 14b which are sensitive to polarization are suggested in cases where it is desired to measure the polarization, that is, the change in resistivity as a function of orientation of the material 12. Further, with polarization-sensitive electrodes 14a, 14b, it is possible to locate faults within polarized materials 12. It should be noted that polarization-sensitive electrodes 14a, 14b may also be used to measure the resistivity of a nonpolarized material 12, but if it is desired to measure polarization effects, polarization insensitive electrodes 14a, 14b should not be used.

Figure 2:
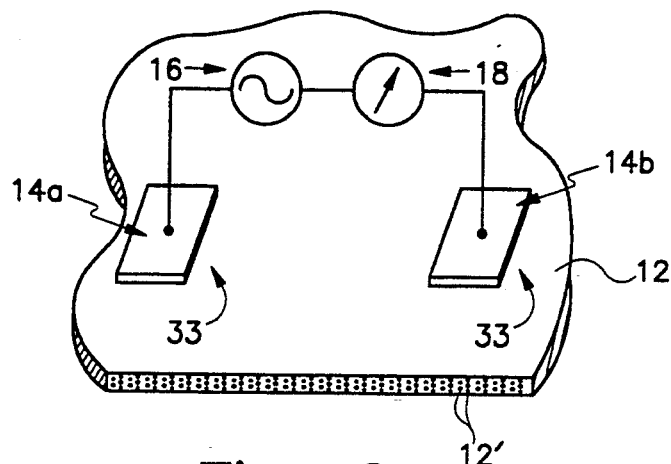
FIG. 2 is a schematic diagram illustrating capacitive coupling between dual electrodes of FIG. 1 and a material under test.

In the electrode configuration 14 shown in FIGS. 1 through 3, the spaced rectangular electrodes 14a, 14b are essentially sensitive to polarization. Other suitable electrodes 14a, 14b for the system 10 are shown in FIGS. 5A through 5D. In these other embodiments, as with the first embodiment, the electrodes 14a, 14b are configured so that they are significantly smaller than the wavelength $\lambda$ associated with the predetermined frequency f of the periodic signal 22.

Figure 5A:
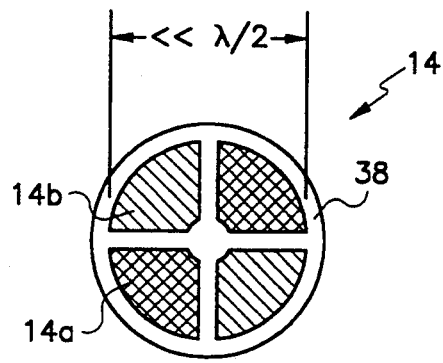
FIG. 5A is a plan view of a second embodiment for implementing the dual electrodes of FIG. 1.

As shown in a second embodiment of FIG. 5A, the transmission electrode 14a and the reception electrode 14b can collectively form a substantially planar circular body having four quadrants on an electrode surface 38, preferably dielectric material. Two nonadjacent quadrants constitute the transmission electrode 14a and send signals from the material 12. The second embodiment is insensitive to polarization of the material 12.

It should be further noted that, in the second embodiment as well as the others described herein, the electrodes 14a, 14b may be recessed within the dielectric surface 38 or the dielectric surface 38 may protrude outwardly slightly between the electrodes 14a, 14b so that it is essentially flush with the electrodes 14a, 14b. The foregoing configurations would help in isolating the electrodes 14a, 14b from each other, similar to first embodiment having the dielectric spacer 37 (FIG. 3) interposed between the electrodes 14a, 14b.

Figure 5B:
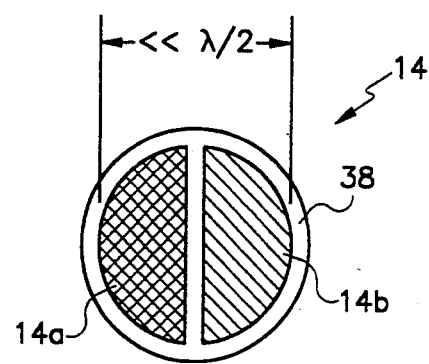
FIG. 5B is a plan view of a third embodiment for implementing the dual electrodes of FIG. 1.

In a third embodiment as illustrated in FIG. 5B, the transmission electrode 14a and the reception electrode 14b are each substantially planar circular body having two hemispherical segments which are opposed to one another. The third embodiment is sensitive to material polarization.

Figure 5C:
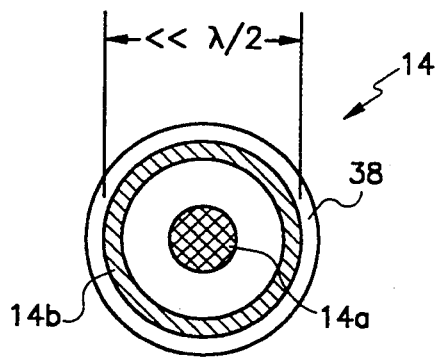
FIG. 5C is a plan view of a fourth embodiment for implementing the dual electrodes of FIG. 1.

In a fourth embodiment as shown in FIG. 5C, the transmission electrode 14a is a substantially planar circular body and the reception electrode 14b is a planar ring associated with and situated around the transmission electrode 14a. The fourth embodiment is insensitive to polarization of the material 12.

Figure 5D:
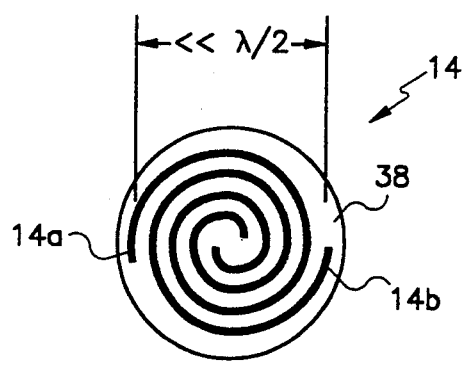
FIG. 5D is a plan view of a fifth embodiment for implementing the dual electrodes of FIG. 1.

Finally, in a fifth embodiment shown in FIG. 5D, the electrodes 14a, 14b spiral about each other starting at the center and continuing outwardly toward the outer periphery. This configuration is also insensitive to polarization of the material 12.

Generally, the system 10 and related methodology may be applied to a wide variety of materials 12 and to a wide variety of investigation/measurement situations. For instance, the system 10 can be used to detect contaminants in industrial fluids, including water, liquid lubricants, solvents, etc. The system 10 can be used to determine the contents and purity of food for perhaps certification by a government agency. In this regard, the amount of fat, salt, or water in a food product can be measured by the system 10, while the food product remains confined within a container. The system 10 can be used for measuring the uniformity or homogeneity of composite materials. The system 10 can be used to measure the impedance and performance of composite materials. Indeed, the system 10 of the present invention has an infinite number of applications and useful purposes, and the foregoing list is intended to be merely exemplary, not exhaustive.

It will be obvious to those skilled in the art that many modifications may be made to the preferred embodiment of the present invention as well as the alternate embodiments of subsystems thereof without substantially departing from the principles of the present invention. All such modifications are intended to be included herein within the scope of the present invention, as set forth in the following claims.

Wherefore, the following is claimed herein:

1. A system for accurate contactless measurement of the resistivity of a material via capacitive coupling, comprising:
   a first induction transformer having a first primary coil and a first secondary coil, said first primary coil for receiving a periodic signal;
   a first transmission line stub connected to said first secondary coil;
   a transmission electrode connected to said first transmission line stub, said transmission electrode for capacitively coupling to a material when said material is disposed in close proximity to said transmission electrode;
   a reception electrode for capacitively coupling to said material when said material is capacitively coupled to said transmission electrode;
   a second transmission line stub connected to said reception electrode; and
   a second induction transformer having a second primary coil and a second secondary coil, said second primary coil being connected to said second transmission line stub, said second secondary coil for generating a resistivity signal indicative of the resistivity of said material.

2. The system of claim 1, wherein said first transmission line stub and said second transmission line stub are both quarter-wavelength stubs.

3. The system of claim 1, wherein said periodic signal exhibits a frequency within the VHF range.

4. The system of claim 1, further comprising a termination resistance connected across the first secondary coil for inhibiting reflections.

5. The system of claim 1, further comprising a termination resistance connected across the second secondary coil for inhibiting reflections.

6. The system of claim 1, wherein the frequency of said periodic signal and coil ratios of said first and second induction transformers are defined so that said first transmission line stub, said transmission electrode, said reception electrode, said second transmission line stub, and said second induction transformer form a series resonant circuit when said transmission electrode and said reception electrode are in close proximity to a conductor.

7. The system of claim 1, wherein said transmission electrode is a planar circular body and wherein said reception electrode is a planar ring associated with and around said transmission electrode.

8. The system of claim 1, wherein said transmission electrode and said reception electrode collectively form a planar circular body having four quadrants and wherein two nonadjacent quadrants send signals to said materials and two other nonadjacent quadrants receive signals from said material.

9. The system of claim 1, wherein said transmission electrode and said reception electrode are each substantially hemispherical and are disposed to form a substantially circular configuration.

10. The system of claim 1, wherein said transmission and reception electrodes are each formed in a spiraling configuration and are disposed adjacent each other so as to spiral about each other.

11. The system of claim 2, further comprising:
an oscillator means connected to said first primary coil, said oscillator means for generating said periodic signal; and
a detector means connected to said second secondary coil, said detector means for generating the resistivity from said resistivity signal.

12. The system of claim 3, wherein said periodic signal exhibits a frequency of approximately 155.5 MHz.

13. The system of claim 11, further comprising a user interface connected to said detector means for observation of said resistivity by a user.

14. A system for accurate contactless measurement of the resistivity of a material via capacitive coupling, comprising:
a first induction transformer having a first primary coil and a first secondary coil, said first primary coil for receiving a periodic signal;
a first transmission line stub connected to said first secondary coil;
a transmission electrode connected to said first transmission line stub, said transmission electrode for capacitively coupling to a material when said material is disposed in close proximity to said transmission electrode;
a reception electrode for capacitively coupling to said material when said material is capacitively coupled to said transmission electrode;
a second transmission line stub connected to said reception electrode;
a second induction transformer having a second primary coil and a second secondary coil, said second primary coil being connected to said second transmission line stub, said second secondary coil for generating a resistivity signal indicative of the resistivity of said material;
wherein said first and second transmission line stubs prevent transmission and reception of signals by said transmission and reception electrodes respectively in the absence of said material; and
wherein said transmission and reception electrodes, said first and second induction transformers, and said first and second transmission line stubs form a series resonant circuit which is tuned for said periodic signal.

15. A system for accurate contactless measurement of the resistivity of a material via capacitive coupling, comprising:
a first induction transformer having a first primary coil and a first secondary coil, said first primary coil for receiving a periodic signal;
a first quarter-wavelength stub connected to said first secondary coil;
a transmission electrode connected to said first quarter-wavelength stub, said transmission electrode for capacitively coupling to a material when said material is disposed in close proximity to said transmission electrode;
a reception electrode spaced from said transmission electrode, said reception electrode for capacitively coupling to said material when said material is capacitively coupled to said transmission electrode;
a second quarter-wavelength stub connected to said reception electrode;
a second induction transformer having a second primary coil and a second secondary coil, said second primary coil being connected to said second quarter-wavelength stub, said second secondary coil for providing said resistivity;
wherein said first induction transformer, said second induction transformer, said first quarter-wavelength stub, and said second quarter-wavelength stub contribute an inductance as determined at said first primary coil of said first induction transformer which is substantially equivalent in magnitude to a capacitance contributed by the combination of said spaced transmission and reception electrodes when said electrodes are in close proximity to a highly conductive material.

16. A method for forming a system for accurately measuring the resistivity of a material via capacitive coupling with the material, comprising the steps of:
disposing transmission and reception electrodes in a spaced adjacent relationship so that said electrodes can concurrently and capacitively couple to a material;
connecting a transmission line stub to each of said electrodes for inhibiting transmission and reception of signals by said transmission and reception electrodes respectively in the absence of said material; and
isolating each said transmission line stub with a transformer, a first transformer adapted to receive a periodic signal and a second transformer adapted to produce a resistivity signal.

17. The method of claim 16, further comprising the step of selecting said first induction transformer, said second induction transformer, and said stubs so that a capacitance contributed by the combination of said spaced transmission and reception electrodes is counteracted.

18. A method for forming a system for accurately measuring the resistivity of a material via capacitive coupling with the material, comprising the steps of:
identifying a wavelength of a periodic signal to be coupled to the material;
determining a length for a quarter-wavelength stub;
disposing transmission and reception electrodes in a spaced adjacent relationship so that said electrodes can concurrently and capacitively couple to the material;

connecting a transmission line stub having said length to each of said transmission and reception electrodes;

isolating each said transmission line stub with a transformer, a first transformer adapted to receive a periodic signal and a second transformer adapted to produce a resistivity signal; and defining the coil ratios of said first and second transformers so that the circuit formed by said first and second transmission line stubs, said first and second transformers, and said transmission and reception electrodes is resonant at said wavelength of said periodic signal when said transmission and reception electrodes are in close proximity to a conductive material.

* * * * *